(12) United States Patent
Meng (10) Patent No.: US 11,870,011 B2
(45) Date of Patent: Jan. 9, 2024

(54) LIGHT-EMITTING DIODE AND METHOD OF MANUFACTURING THE SAME, AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventor: Hu Meng, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 825 days.

(21) Appl. No.: 16/957,058

(22) PCT Filed: Jun. 25, 2019

(86) PCT No.: PCT/CN2019/092803
§ 371 (c)(1),
(2) Date: Jun. 22, 2020

(87) PCT Pub. No.: WO2020/258033
PCT Pub. Date: Dec. 30, 2020

(65) Prior Publication Data
US 2023/0155068 A1    May 18, 2023

(51) Int. Cl.
*H01L 33/44* (2010.01)
*H01L 33/14* (2010.01)
(Continued)

(52) U.S. Cl.
CPC ............ *H01L 33/44* (2013.01); *H01L 33/145* (2013.01); *H01L 33/20* (2013.01); *H01L 33/38* (2013.01);
(Continued)

(58) Field of Classification Search
CPC ... H01L 33/44; H01L 33/145; H01L 25/0753; H01L 33/20; H01L 25/167;
(Continued)

(56) References Cited

U.S. PATENT DOCUMENTS 6,526,083 B1    2/2003 Kneissl et al.
11,107,954 B2 *  8/2021 Ebbecke ................. H01L 33/30
(Continued)

FOREIGN PATENT DOCUMENTS

CN    2434788 Y    6/2001
CN    101740691 A    6/2010
(Continued)

OTHER PUBLICATIONS

First Chinese Office Action for related Application No. 201980000904.5, dated Jan. 14, 2022, 16 pages.

*Primary Examiner* — Savitri Mulpuri
(74) *Attorney, Agent, or Firm* — Procopio, Cory, Hargreaves & Savitch LLP (57) ABSTRACT

A light-emitting diode includes a first semiconductor layer, a second semiconductor layer, a light-emitting layer disposed between the first semiconductor layer and the second semiconductor layer, and a barrier layer disposed on at least part of a side face of at least one of the first semiconductor layer and the second semiconductor layer. The barrier layer is configured to form a charge depletion region between the barrier layer and the at least part of the side face.

17 Claims, 9 Drawing Sheets

(51) Int. Cl.
*H01L 33/20* (2010.01)
*H01L 33/38* (2010.01)
*H01L 25/16* (2023.01)

(52) U.S. Cl.
CPC .... *H01L 25/167* (2013.01); *H01L 2933/0025* (2013.01)

(58) Field of Classification Search
CPC . H01L 2933/0025; H01L 33/62; H01L 33/38; H01L 33/0093
See application file for complete search history.

(56) References Cited

U.S. PATENT DOCUMENTS

| | | |
|---|---|---|
| 2006/0065901 A1 | 3/2006 | Aoyagi et al. |
| 2011/0095332 A1 | 4/2011 | Hwang et al. |
| 2013/0234182 A1 | 9/2013 | Katsuno et al. |
| 2014/0138697 A1 | 5/2014 | Lin |
| 2014/0217448 A1 | 8/2014 | Kim et al. |
| 2015/0021620 A1 | 1/2015 | Sung et al. |
| 2015/0340551 A1 | 11/2015 | Mei et al. |

FOREIGN PATENT DOCUMENTS

| | | |
|---|---|---|
| CN | 102074628 A | 5/2011 |
| CN | 103022296 A | 4/2013 |
| CN | 104300062 A | 1/2015 |
| CN | 104409585 A | 3/2015 |
| CN | 104813479 A | 7/2015 |
| JP | 2006261266 A | 9/2006 |
| KR | 1020140100115 A | 8/2014 |

\* cited by examiner

LIGHT-EMITTING DIODE AND METHOD OF MANUFACTURING THE SAME, AND DISPLAY DEVICE

CROSS-REFERENCE TO RELATED APPLICATION

This application is a national phase entry under 35 USC 371 of International Patent Application No. PCT/CN2019/092803 filed on Jun. 25, 2019, which is incorporated herein by reference in its entirety.

TECHNICAL FIELD

The present disclosure relates to the field of display technologies, and in particular to a light-emitting diode, a method of manufacturing the light-emitting diode, and a display device having the light-emitting diode.

BACKGROUND

In recent years, as a novel self-luminescence display technology, micro light-emitting diodes (Micro LEDs) have attracted extensive attention. However, in a case where the light-emitting diode is small in size (for example, less than 10 μm), the external quantum efficiency of the light-emitting diode will obviously attenuate. The smaller the size, the lower the external quantum efficiency.

SUMMARY

In one aspect, a light-emitting diode is provided. The light-emitting diode includes a first semiconductor layer, a second semiconductor layer, a light-emitting layer disposed between the first semiconductor layer and the second semiconductor layer, and a barrier layer disposed on at least part of a side face of at least one of the first semiconductor layer and the second semiconductor layer. The barrier layer is configured to form a charge depletion region between the barrier layer and the at least part of the side face.

In some embodiments, the first semiconductor layer is a P-type semiconductor layer and the second semiconductor layer is an N-type semiconductor layer. The barrier layer includes a first barrier layer covering at least part of a side face of the P-type semiconductor layer. A work function of the first barrier layer is less than a work function of the P-type semiconductor layer.

In some embodiments, the first barrier layer includes a first main body portion and a first extension portion. The first main body portion covers the side face of the P-type semiconductor layer. The first extension portion is connected to a side of the first main body portion proximate to the light-emitting layer, and the first extension portion covers a part of a side face of the light-emitting layer proximate to the P-type semiconductor layer. A distance exists between the first extension portion and the N-type semiconductor layer in a direction perpendicular to a main surface of the light-emitting layer.

In some embodiments, the first barrier layer further includes a second extension portion connected to a side of the first main body portion away from the light-emitting layer. The second extension portion covers an edge of a main surface of the P-type semiconductor layer away from the light-emitting layer.

In some embodiments, an orthographic projection of the first barrier layer on the main surface of the light-emitting layer has a closed frame shape.

In some embodiments, the work function of the first barrier layer ranges from 4.0 eV to 5.5 eV.

In some embodiments, an absolute value of a difference between the work function of the first barrier layer and the work function of the P-type semiconductor layer is greater than or equal to 0.3 eV.

In some embodiments, a material of the first barrier layer includes at least one of metal, conductive metal oxide, graphene and metallic carbon nanotube.

In some embodiments, the first semiconductor layer is a P-type semiconductor layer and the second semiconductor layer is an N-type semiconductor layer. The barrier layer includes a second barrier layer covering at least part of a side face of the N-type semiconductor layer. A work function of the second barrier layer is greater than a work function of the N-type semiconductor layer.

In some embodiments, an orthographic projection of the second barrier layer on a plane determined by the light-emitting layer has a closed frame shape.

In some embodiments, the work function of the second barrier layer ranges from 4.5 eV to 5.1 eV.

In some embodiments, an absolute value of a difference between the work function of the second barrier layer and the work function of the N-type semiconductor layer is greater than or equal to 0.3 eV.

In some embodiments, a material of the second barrier layer includes at least one of metal, conductive metal oxide, graphene and metallic carbon nanotube.

In some embodiments, the first semiconductor layer is a P-type semiconductor layer and the second semiconductor layer is an N-type semiconductor layer. The barrier layer includes a first barrier layer covering at least part of a side face of the P-type semiconductor layer, and a second barrier layer covering at least part of a side face of the N-type semiconductor layer. A distance exists between the first barrier layer and the second barrier layer in a direction perpendicular to the main surface of the light-emitting layer.

In some embodiments, the second semiconductor layer has a main body region and a second electrode placement region. A part of the second semiconductor layer in the main body region overlaps the light-emitting layer and the first semiconductor layer, and a part of the second semiconductor layer in the second electrode placement region does not overlap the light-emitting layer and the first semiconductor layer. The light-emitting diode further includes a base, a first electrode, and a second electrode. The base is disposed on a side of the second semiconductor layer away from the light-emitting layer. The first electrode is disposed on a main surface of the first semiconductor layer away from the light-emitting layer. The second electrode is disposed in the second electrode placement region of the second semiconductor layer.

In another aspect, a method of manufacturing a light-emitting diode is provided. The method includes: providing a base; forming, on the base, a second semiconductor layer, a light-emitting layer and a first semiconductor layer sequentially on top of one another; patterning the first semiconductor layer to remove a part of the first semiconductor layer at an edge of a light-emitting region of the light-emitting diode; forming a first barrier film at a side of the base at which the patterned first semiconductor layer has been formed; and patterning the first barrier film to retain a part of the first barrier film covering a side face of the patterned first semiconductor layer and form a first barrier layer. The first barrier layer is configured to form a charge depletion region between the first barrier layer and the first semiconductor layer.

In some embodiments, after the step of patterning the first semiconductor layer, the method further includes: etching, by using a mask used for patterning the first semiconductor layer, a part of the light-emitting layer at the edge of the light-emitting region. An etching depth is less than a thickness of the light-emitting layer.

In some embodiments, in the step of patterning the first barrier film, a part of the first barrier film covering an edge of a main surface of the patterned first semiconductor layer in the light-emitting region is retained.

In some embodiments, before forming the light-emitting layer, the method further includes: patterning the second semiconductor layer to remove a part of the second semiconductor layer at the edge of the light-emitting region, forming a second barrier film at a side of the base on which the patterned second semiconductor layer has been formed, and patterning the second barrier film to retain a part of the second barrier film covering a side face of the patterned second semiconductor layer and form a second barrier layer. The second barrier layer is configured to form a charge depletion region between the second barrier layer and the second semiconductor layer.

In yet another aspect, a display device is provided. The display device includes a driving substrate and a plurality of light-emitting diodes mounted on a side of the driving substrate. Each light-emitting diode is a light-emitting diode described in any one of the above embodiments, and each light-emitting diode is electrically connected to the driving substrate.

BRIEF DESCRIPTION OF THE DRAWINGS

In order to describe technical solutions of embodiments of the present disclosure more clearly, the accompanying drawings to be used in the description of the embodiments will be described briefly below. Obviously, the accompanying drawings to be described below are merely some embodiments of the present disclosure, and a person of ordinary skill in the art can obtain other drawings according to these drawings.

DETAILED DESCRIPTION

Some embodiments of the present disclosure will be described below with reference to the accompanying drawings. Obviously, the embodiments to be described are merely some embodiments of the present disclosure rather than all embodiments. All other embodiments made on the basis of embodiments provided in the present disclosure by a person of ordinary skill in the art are within the protection scope of the present disclosure.

The terms "first" and "second" are for illustration purposes only and are not to be construed as indicating or implying relative importance or implied reference to the quantity of indicated technical features. Therefore, features defined as "first" and "second" may explicitly or implicitly include one or more of the features. In the description of the embodiments of the present disclosure, unless otherwise stated, "a/the plurality of" means two or more.

In the description of the embodiments of the present disclosure, it should be noted that, terms "mounted", "connected" and "connection" should be understood in a broad sense unless specifically defined or limited. For example, it may be a permanent connection, a detachable connection, or it may be an integrated connection; it may be directly connected, indirectly connected through an intermediate medium, or it may be internal connection between two components. For a person of ordinary skill in the art, the specific meaning of the above mentioned terms in the present disclosure can be understood in specific circumstances.

In a case where a size of light-emitting diode is reduced, the proportion of a leakage current to a total current in a sidewall of the light-emitting diode is increased, and the transition of most carriers occurs through a non-radiative recombination mechanism in the surface of the sidewall. Therefore, in a case where the light-emitting diode is small in size, for example, less than 10 μm, the external quantum efficiency of the light-emitting diode will obviously attenuate. The smaller the size, the lower the external quantum efficiency.

In the related art, the micro light-emitting diode is manufactured by a mild dry etching process or a passivation film is manufactured on the sidewall of the micro light-emitting diode. In this way, the density of defects and the density of recombination centers in a side face of the micro light-emitting diode may be reduced. However, the mild dry etching will make uniformity and line width of patterning processes of film layers in the micro light-emitting diode worse, and the manufacture of the passivation film usually requires a high-temperature annealing process, both of which result in insufficient reduction of the density of defects and the density of recombination centers in the side face of the micro light-emitting diode. Consequently, there is still a large leakage current in the surface of the sidewall. The external quantum efficiency of the micro light-emitting diode cannot be improved obviously.

Figure 1:
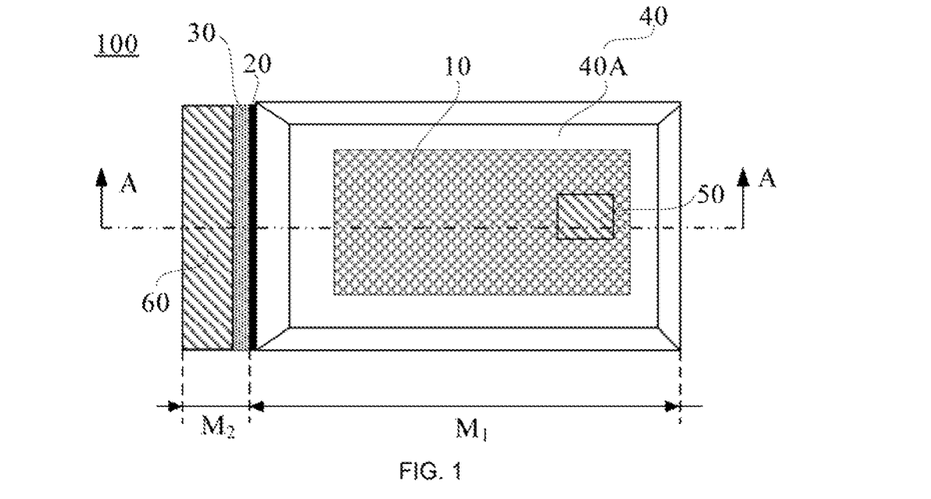
FIG. 1 is a top view of a light-emitting diode, according to some embodiments of the present disclosure.
Figure 2:
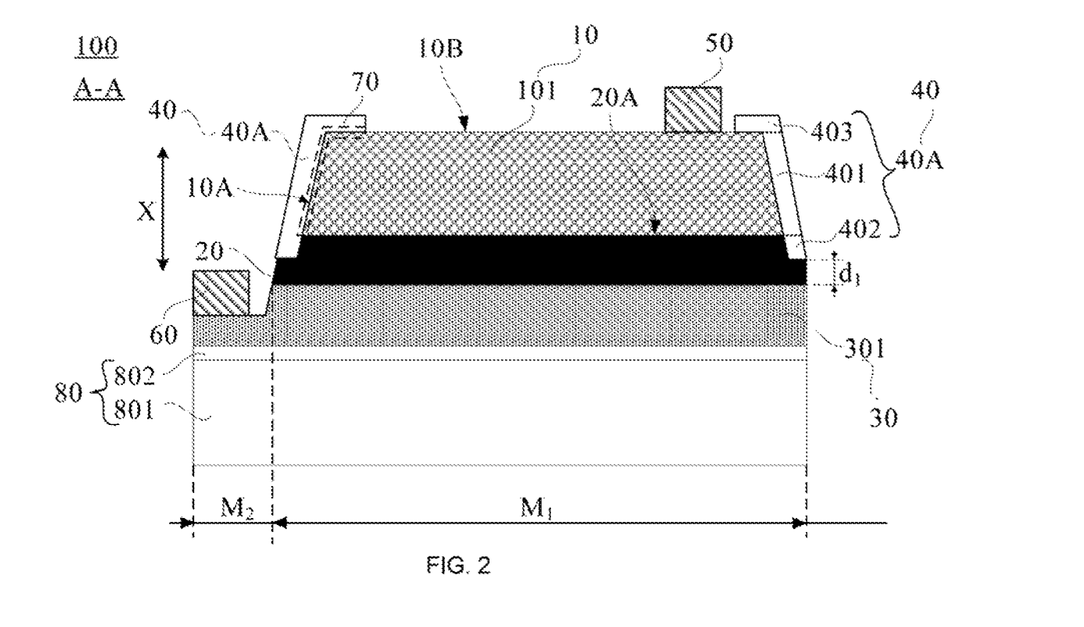
FIG. 2 is a sectional view of the light-emitting diode in FIG. 1 along a A-A direction.

Referring to FIGS. 1 and 2, some embodiments of the present disclosure provide a light-emitting diode 100. The light-emitting diode 100 includes a first semiconductor layer 10, a light-emitting layer 20, a second semiconductor layer 30 and a barrier layer 40.

The light-emitting layer 20 is disposed between the first semiconductor layer 10 and the second semiconductor layer 30. Exemplarily, one of the first semiconductor layer 10 and the second semiconductor layer 30 is a P-type semiconductor layer, and the other is an N-type semiconductor layer. When a voltage is applied to the light-emitting diode 100, the electrons in the N-type semiconductor layer transfer to the light-emitting layer 20 and enter the light-emitting layer 20; the holes in the P-type semiconductor layer also transfer to the light-emitting layer 20 and enter the light-emitting layer 20. Recombination of the electrons and holes that enter the light-emitting layer 20 occurs, and thereby spontaneous emission light is generated. Herein, exemplarily, the light-emitting layer 20 is a multiple quantum well (MQW) layer.

The barrier layer 40 is disposed on at least part of a side face of at least one of the first semiconductor layer 10 and the second semiconductor layer 30 (for example, the side face 10A of the first semiconductor layer shown in FIG. 2), and the barrier layer 40 is configured to form a charge depletion region 70 between the barrier layer 40 and the at least part of the side face. In this way, due to the presence of the charge depletion region 70, the carriers (holes and/or electrons) moving in the first semiconductor layer 10 and/or the second semiconductor layer 30 are away from the at least part of the side face, and thereby the lateral current of the light-emitting diode may be suppressed. It is less likely for the leakage current to occur in the at least part of the side face, and the external quantum efficiency of the light-emitting diode may be improved.

It will be noted that the charge depletion region 70 is a region with a high resistance value. Due to the presence of the charge depletion region 70, when the carriers (holes and/or electrons) in the first semiconductor layer 10 and/or the second semiconductor layer 30 move toward the at least part of the side face, it is needed to overcome a Schottky barrier. As a result, these moving carriers are mainly concentrated at a position away from the at least part of the side face. In this way, lateral suppression to the injected current may be achieved, the non-radiative recombination of carriers in the at least part of the side face due to the defects and recombination centers may be reduced, and it is beneficial to improve the luminescence efficiency of the light-emitting diode 100.

There are various structures and arrangements of the barrier layer 40, including but not limited to the structures and arrangements of the barrier layer 40 illustrated in the following embodiments.

In some embodiments, as shown in FIG. 2, the first semiconductor layer 10 is a P-type semiconductor layer 101 and the second semiconductor layer 30 is an N-type semiconductor layer 301. The barrier layer 40 includes a first barrier layer 40A covering at least part of the side face 10A of the P-type semiconductor layer 101, and a work function of the first barrier layer 40A is less than a work function of the P-type semiconductor layer 101.

In this design, during a process of the first barrier layer 40A and the P-type semiconductor layer 101 reaching thermal equilibrium, electrons in the first barrier layer 40A move into the P-type semiconductor layer 101, and thereby a built-in electric field is formed and band bending of the semiconductor occurs. Moreover, when the first barrier layer 40A and the P-type semiconductor layer 101 reach thermal equilibrium, Fermi levels of the two remain the same. Between the first barrier layer 40A and the P-type semiconductor layer 101, the electrons in the first barrier layer 40A and the holes in the P-type semiconductor layer 101 combine, and the charge depletion region 70 (i.e., a region with a high resistance value) is formed.

Due to the presence of the charge depletion region 70, a distribution of a hole current in the P-type semiconductor layer 101 will change, that is, the hole current is mainly concentrated in the body region of the P-type semiconductor layer 101. Therefore, the lateral suppression to the injected hole current may be achieved, the non-radiative recombination of the hole current in the side face 10A of the P-type semiconductor layer 101 due to defects and recombination centers may be avoided, and the leakage current in the at least part of the side face 10A may be reduced. Thus, the external quantum efficiency of the light-emitting diode may be improved, that is, the luminescence efficiency of the light-emitting diode may be improved.

Exemplarily, as shown in FIG. 2, the first barrier layer 40A includes a first main body portion 401 and a first extension portion 402.

The first main body portion 401 covers the side face 10A of the P-type semiconductor layer 101. In this way, a charge depletion region is formed between the first main body portion 401 and the entire side face 10A of the P-type semiconductor layer 101. Thus, better lateral suppression to the injected current may be achieved, and the leakage current in the side face 10A of the P-type semiconductor layer 101 may be reduced.

The first extension portion 402 is connected to a side of the first main body portion 401 proximate to the light-emitting layer 20. The first extension portion 402 covers a part of the side face of the light-emitting layer 20 proximate to the P-type semiconductor layer 101. In this design, it is less likely for the leakage current to occur at an end of the side face 10A proximate to the light-emitting layer 20, and it is beneficial to reduce the difficulty of processing the first barrier layer 40A.

A distance $d_1$ exists between the first extension portion 402 and the N-type semiconductor layer 301 in a direction perpendicular to a main surface of the light-emitting layer 20 (an X direction shown in FIG. 2). This design may prevent the first barrier layer 40A and the N-type semiconductor layer 301 from affecting each other, so that a stable and reliable charge depletion region may be generated between the first barrier layer 40A and the P-type semiconductor layer 101.

On this basis, exemplarily, as shown in FIG. 2, the first barrier layer 40A further includes a second extension section 403 connected to a side of the first main body portion 401 away from the light-emitting layer 20, and the second extension section 403 covers an edge of a main surface 10B of the P-type semiconductor layer 101 away from the light-emitting layer 20. In this design, it is less likely for the leakage current to occur at an end of the side face 10A proximate to the main surface 10B, and it is beneficial to reduce the difficulty of processing the first barrier layer 40A.

Exemplarily, as shown in FIGS. 1 and 2, an orthographic projection of the first barrier layer 40A on the main surface 20A of the light-emitting layer 20 has a closed frame shape. In this way, the charge depletion region 70 is formed between the first barrier layer 40A and the entire side face 10A of the P-type semiconductor layer 101. Thus, better lateral suppression to the injected current may be achieved, the leakage current in the side face 10A of the P-type semiconductor layer 101 may be reduced, and the luminescence efficiency of the light-emitting diode 100 may be improved.

Herein, it will be noted that the orthographic projection of the first barrier layer 40A on the main surface 20A of the light-emitting layer 20 is not limited to the closed frame shape. For example, the first barrier layer 40A includes at least two parts; the at least two parts surround the side face of the P-type semiconductor layer 101, and are sequentially arranged and spaced apart from each other.

Exemplarily, a material of the first barrier layer 40A includes at least one of metal, conductive metal oxide, graphene and metallic carbon nanotube. For example, the first barrier layer 40A is a metal layer or a conductive metal oxide layer, a thickness of which is 200 nm to 300 nm; for another example, the first barrier layer 40A is one or two layers of graphene.

In some possible designs, the work function of the first barrier layer 40A ranges from 4.0 eV to 5.5 eV. A material within this range includes, but is not limited to, titanium, aluminum, silver, indium, molybdenum, copper, chromium, gold, etc. In a case where the work function of the first barrier layer 40A is 4.0 eV to 5.5 eV, the work function of the first barrier layer 40A is less than the work function of the P-type semiconductor layer 101 (the work function of the P-type semiconductor layer 101 usually ranges from 6 eV to 7 eV). Therefore, the charge depletion region 70 is formed between the first barrier layer 40A and the side face 10A of the P-type semiconductor layer 101, and the leakage current in the side face 10A of the P-type semiconductor layer 101 may be reduced.

On this basis, exemplarily, an absolute value of a difference between the work function of the first barrier layer 40A and the work function of the P-type semiconductor layer 101 is greater than or equal to 0.3 eV. In this way, the charge depletion region 70 formed between the first barrier layer 40A and the P-type semiconductor layer 101 has a high Schottky barrier, which may effectively prevent the hole current in the P-type semiconductor layer 101 from leaking out from the side face 10A of the P-type semiconductor layer 101, and thus the light-emitting diode may have high stability and reliability.

Figure 3:
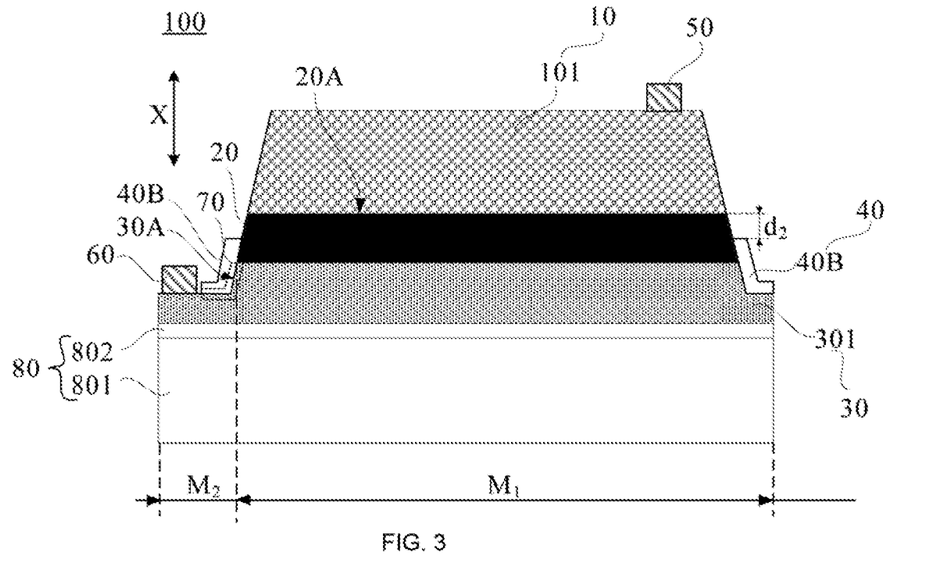
FIG. 3 is a sectional view showing a structure of another light-emitting diode, according to some embodiments of the present disclosure.

In some other embodiments, as shown in FIG. 3, the barrier layer 40 includes a second barrier layer 40B covering at least part of a side face 30A of the N-type semiconductor layer 301, and a work function of the second barrier layer 40B is greater than a work function of the N-type semiconductor layer 301.

In this design, during a process of the second barrier layer 40B and the N-type semiconductor layer 301 reaching thermal equilibrium, electrons in the N-type semiconductor layer 301 move into the second barrier layer 40B, and thereby a built-in electric field is formed and band bending of the semiconductor occurs. Moreover, when the second barrier layer 40B and the N-type semiconductor layer 301 reach thermal equilibrium, Fermi levels of the two remain the same. Between the second barrier layer 40B and the N-type semiconductor layer 301, the electrons in the N-type semiconductor layer 301 and the holes in the second barrier layer 40B combine, and a charge depletion region 70 (i.e., a region with a high resistance value) is formed.

Due to the presence of the charge depletion region 70, a distribution of an electron current in the N-type semiconductor layer 301 will change, that is, the electron current is mainly concentrated in the body region of the N-type semiconductor layer 301. Therefore, the lateral suppression to the injected electron current may be achieved, the non-radiative recombination of the electron current in the side face 30A of the N-type semiconductor layer 301 due to defects and recombination centers may be avoided, and the leakage current in the at least part of the side face 30A may be reduced. Thus, the external quantum efficiency of the light-emitting diode may be improved, that is, the luminescence efficiency of the light-emitting diode may be improved.

Exemplarily, as shown in FIG. 3, the second barrier layer 40B covers the entire side face 30A of the N-type semiconductor layer 301. In this way, the charge depletion region 70 is formed between the second barrier layer 40B and the entire side face 30A of the N-type semiconductor layer 301. Thus, better lateral suppression to the injected current may be achieved, and the leakage current in the side face 30A of the N-type semiconductor layer 301 may be reduced.

On this basis, exemplarily, as shown in FIG. 3, the second barrier layer 40B covers a part of the side face of the light-emitting layer 20 proximate to the N-type semiconductor layer 301. In this design, it is less likely for the leakage current to occur at an end of the side face 30A proximate to the light-emitting layer 20, and it is beneficial to reduce the difficulty of processing the second barrier layer 40B.

A distance $d_2$ exists between the second barrier layer 40B and the P-type semiconductor layer 101 in the direction perpendicular to the main surface of the light-emitting layer 20 (the X direction shown in FIG. 3). This design may prevent the second barrier layer 40B and the P-type semiconductor layer 101 from affecting each other, so that a stable and reliable charge depletion region may be generated between the second barrier layer 40B and the N-type semiconductor layer 301.

Exemplarily, as shown in FIG. 3, an orthographic projection of the second barrier layer 40B on the main surface 20A of the light-emitting layer 20 has a closed frame shape. In this way, the charge depletion region 70 is formed between the second barrier layer 40B and the entire side face 30A of the N-type semiconductor layer 301. Thus, better lateral suppression to the injected current may be achieved, the leakage current in the side face 30A of the N-type semiconductor layer 301 may be reduced, and the luminescence efficiency of the light-emitting diode 100 may be improved.

Herein, it will be noted that the orthographic projection of the second barrier layer 40B on the main surface 20A of the light-emitting layer 20 is not limited to the closed frame shape. For example, the second barrier layer 40A includes at least two parts; the at least two parts surround the side face 30A of the N-type semiconductor layer 301, and are sequentially arranged and spaced apart from each other.

Exemplarily, a material of the second barrier layer 40B includes at least one of metal, conductive metal oxide, graphene and metallic carbon nanotube. For example, the second barrier layer 40B is a metal layer or a conductive metal oxide layer, a thickness of which is 200 nm to 300 nm; for another example, the second barrier layer 40B is one or two layers of graphene.

Exemplarily, the work function of the second barrier layer 40B ranges from 4.5 eV to 5.1 eV. A material within this range includes, but is not limited to, molybdenum, copper, chromium, gold, nickel, etc. In a case where the work function of the second barrier layer 40B is 4.5 eV to 5.1 eV, the work function of the second barrier layer 40B is greater than the work function of the N-type semiconductor layer 301 (the work function of the N-type semiconductor layer 301 usually ranges from 4.0 eV to 4.2 eV). Therefore, the charge depletion region 70 is formed between the second barrier layer 40B and the side face 30A of the N-type semiconductor layer 301, and the leakage current in the side face 30A of the N-type semiconductor layer 301 may be reduced.

On this basis, exemplarily, an absolute value of a difference between the work function of the second barrier layer 40B and the work function of the N-type semiconductor layer 301 is greater than or equal to 0.3 eV. In this way, the charge depletion region 70 formed between the second barrier layer 40B and the N-type semiconductor layer 301 has a high Schottky barrier, which may effectively prevent the electron current in the N-type semiconductor layer 301 from leaking out from the side face 30A, and thus the light-emitting diode may have high stability and reliability.

Figure 4:
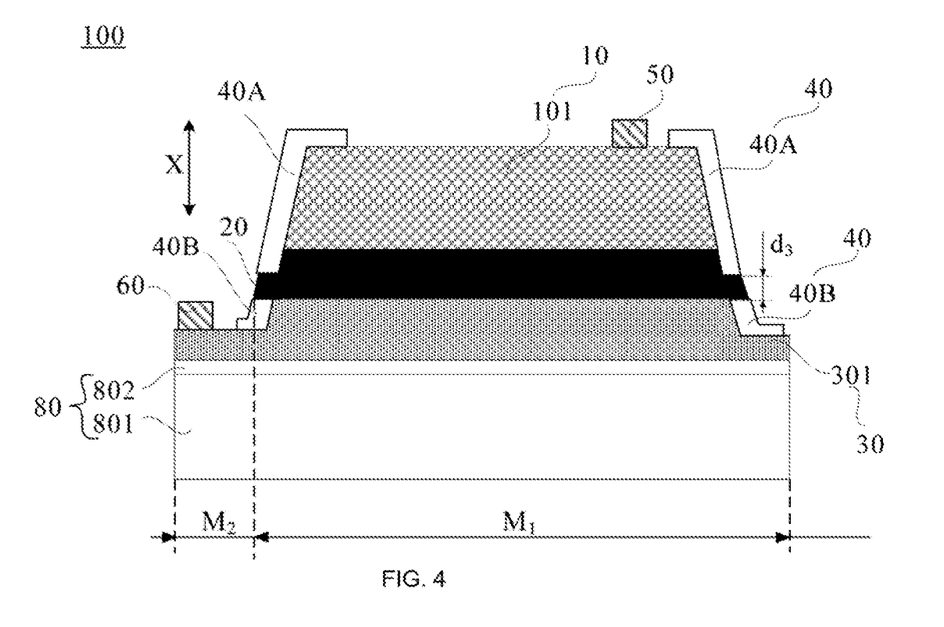
FIG. 4 is a sectional view showing a structure of yet another light-emitting diode, according to some embodiments of the present disclosure.

In some other embodiments, as shown in FIG. 4, the barrier layer 40 includes a first barrier layer 40A covering at least part of the side face 10A of the P-type semiconductor layer 101 and a second barrier layer 40B covering at least part of the side face 30A of the N-type semiconductor layer 301. In this way, the leakage current in the at least part of the side face 10A and the leakage current in the at least part of the side face 30A may be reduced simultaneously. As a result, the external quantum efficiency of the light-emitting diode may be improved, and the luminescence efficiency of the light-emitting diode may be improved.

Exemplarily, as shown in FIG. 4, a distance $d_3$ exists between the first barrier layer 40A and the second barrier layer 40B in the direction perpendicular to the main surface of the light-emitting layer 20 (the X direction shown in FIG. 4). For example, the first barrier layer 40A and the second barrier layer 40B may be separated by the light-emitting layer 20. In this case, the second barrier layer 40B does not cover a part of the side face of the light-emitting layer 20 proximate to the N-type semiconductor layer 301. This design may prevent the first barrier layer 40A and the second barrier layer 40B from affecting each other, so that a stable and reliable charge depletion region may be generated between the first barrier layer 40A and the P-type semiconductor layer 101 and a stable and reliable charge depletion region may be also generated between the second barrier layer 40B and the N-type semiconductor layer 301.

Referring to FIGS. 1-4, in some embodiments, the second semiconductor layer 30 has a main body region $M_1$ and a second electrode placement region $M_2$, a part of the second semiconductor layer 30 in the main body region $M_1$ overlaps the light-emitting layer 20 and the first semiconductor layer 10, and a part of the second semiconductor layer 30 in the second electrode placement region $M_2$ does not overlap the light-emitting layer 20 and the first semiconductor layer 10.

As shown in FIGS. 1-4, the light-emitting diode 100 further includes a base 80, a first electrode 50 and a second electrode 60.

The base 80 is disposed on a side of the second semiconductor layer 30 away from the light-emitting layer 20. By providing the base 80, it is convenient to form the second semiconductor layer 30, the light-emitting layer 20 and the first semiconductor layer 10 that are sequentially stacked on top of one another. Exemplarily, as shown in FIGS. 2-4, the base includes a sapphire base 801 and a buffer layer 802 between the sapphire base 801 and the second semiconductor layer 30.

The first electrode 50 is disposed on the main surface 10B of the first semiconductor layer 10 away from the light-emitting layer 20, and the second electrode 60 is disposed in the second electrode placement region $M_2$ of the second semiconductor layer 30. In this way, carriers (one of holes and electrons) may be injected into the first semiconductor layer 10 through the first electrode 50 and carriers (the other one of holes and electrons) may be injected into the second semiconductor layer 30 through the second electrode 60.

Exemplarily, as shown in FIGS. 2-4, in a case where the first semiconductor layer 10 is a P-type semiconductor layer 101 and the second semiconductor layer 30 is an N-type semiconductor layer 301, the first electrode 50 is an anode and the second electrode 60 is a cathode.

Herein, it will be noted that the first semiconductor layer 10 is one of the P-type semiconductor layer 101 and the N-type semiconductor layer 301, and the second semiconductor layer 30 is the other one of the P-type semiconductor layer 101 and the N-type semiconductor layer 301. In a case where the first semiconductor layer 10 is an N-type semiconductor layer 301 and the second semiconductor layer 30 is a P-type semiconductor layer 101, referring to FIGS. 2-4, the second barrier layer 40B covering the side face 30A of the N-type semiconductor layer 301 includes a structure similar to the second extension portion 403 of the first barrier layer 40A.

Figure 5:
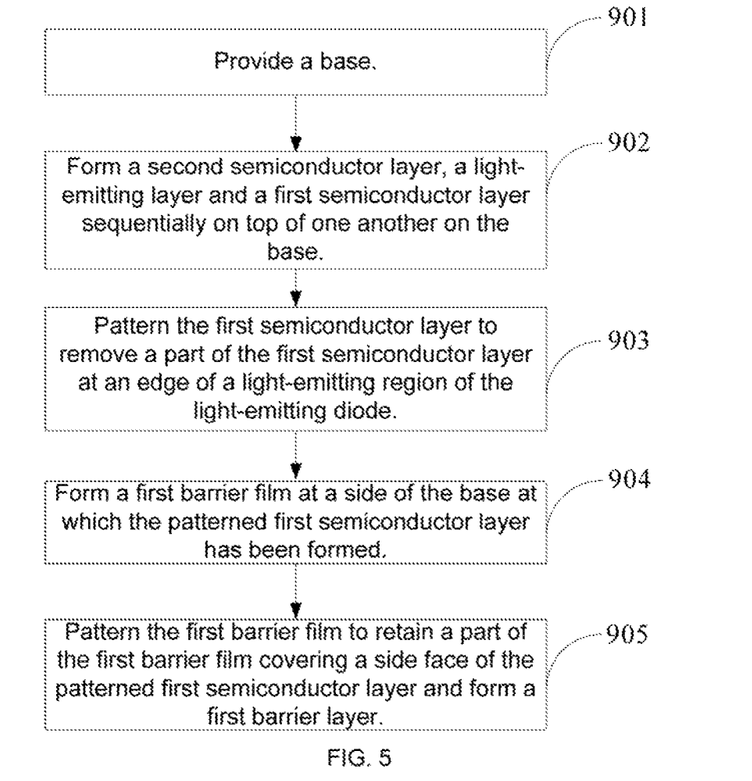
FIG. 5 is a schematic flowchart of a method of manufacturing a light-emitting diode, according to some embodiments of the present disclosure.

Referring to FIG. 5, some embodiments of the present disclosure provide a method of manufacturing a light-emitting diode. The method includes step 901 to step 905.

Figure 6:
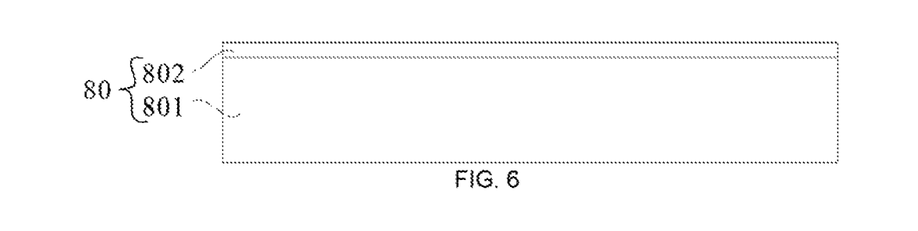
FIGS. 6-14 are schematic diagrams showing steps of a method of manufacturing a light-emitting diode, according to some embodiments of the present disclosure.

In step 901, as shown in FIG. 6, a base 80 is provided.

The base 80 has a supporting function, which make layers formed later (such as the first semiconductor layer, the second semiconductor layer, and the light-emitting layer) have higher stability and reliability. Exemplarily, the base 80 includes a sapphire base 801 and a buffer layer 802 located on a side of the sapphire base 801.

Figure 7:
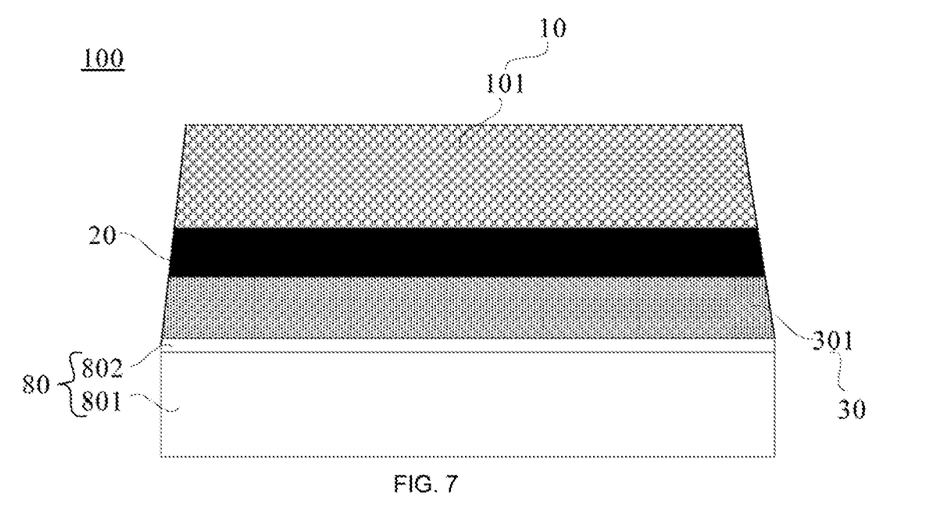

In step 902, as shown in FIG. 7, a second semiconductor layer 30, a light-emitting layer 20 and a first semiconductor layer 10 are sequentially formed on top of one another on the base 80.

The first semiconductor layer 10 is one of the P-type semiconductor layer 101 and the N-type semiconductor layer 301, and the second semiconductor layer 30 is the other one of the P-type semiconductor layer 101 and the N-type semiconductor layer 301. For example, as shown in FIG. 7, the first semiconductor layer 10 is a P-type semiconductor layer 101 and the second semiconductor layer 30 is an N-type semiconductor layer 301. Exemplarily, the step 902 includes, but is not limited to, forming the N-type semiconductor layer 301, the light-emitting layer 20 and the P-type semiconductor layer 101 sequentially on top of one another on a side of the base 80 through an epitaxial growth process.

Figure 8:
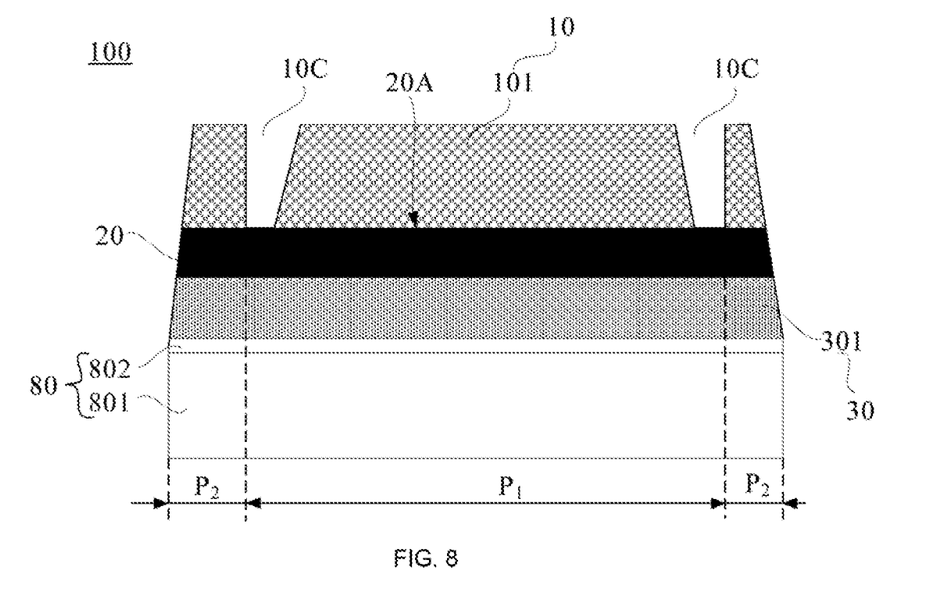
Figure 9:
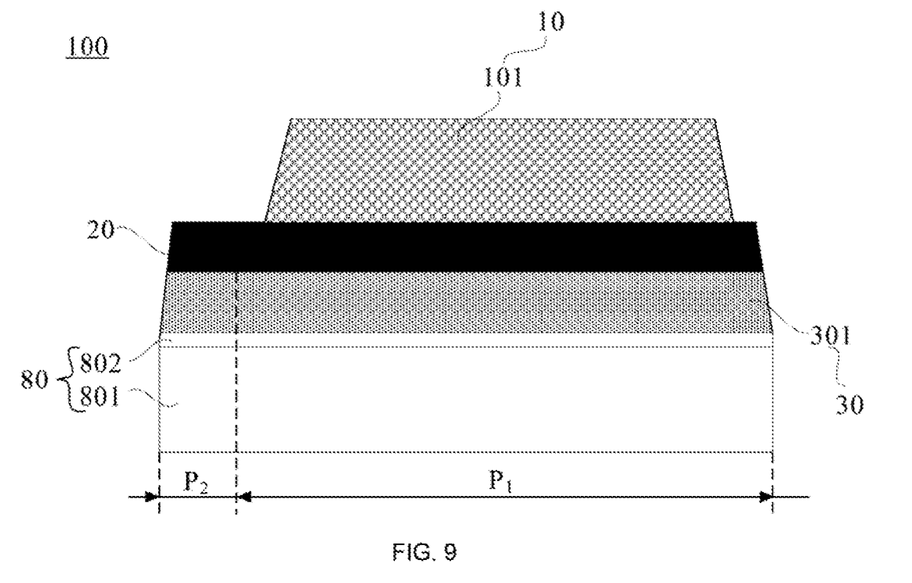

In step 903, as shown in FIGS. 8 and 9, the first semiconductor layer 10 is patterned to remove a part of the first semiconductor layer 10 at an edge of a light-emitting region $P_1$ of the light-emitting diode 100.

The first semiconductor layer 10 is patterned by a patterning process. For example, first, a photoresist layer is formed on a side of the first semiconductor layer 10 away from the light-emitting layer 20; then the photoresist layer is exposed and developed to obtain a patterned photoresist layer, from which a surface of the part of the first semiconductor layer 10 at the edge of the light-emitting region $P_1$ is exposed; finally, the first semiconductor layer 10 is etched by using the patterned photoresist layer to remove the part of the first semiconductor layer 10 at the edge of the light-emitting region $P_1$ of the light-emitting diode 100.

Exemplarily, when the first semiconductor layer 10 is patterned, only the part of the first semiconductor layer 10 at the edge of the light-emitting region $P_1$ of the light-emitting diode 100 is removed (as shown in FIG. 8). Or, a part of the first semiconductor layer 10 in a non-light-emitting region $P_2$ of the light-emitting diode 100 and the part of the first semiconductor layer 10 at the edge of the light-emitting region $P_1$ of the light-emitting diode 100 are removed simultaneously (as shown in FIG. 9). The non-light-emitting region $P_2$ here refers to a region of the light-emitting diode 100 other than the light-emitting region $P_1$.

As shown in FIG. 8, in a case where only the part of the first semiconductor layer 10 at the edge of the light-emitting region $P_1$ of the light-emitting diode is removed, groove(s) 10C are formed in the first semiconductor layer 10. Exemplarily, an orthographic projection of the groove 10C on the main surface 20A of the light-emitting layer 20 has a closed frame shape; or, there is a plurality of grooves 10C, and the plurality of grooves 10C surround the first semiconductor layer 10, and are sequentially arranged and spaced apart from each other.

Figure 10:
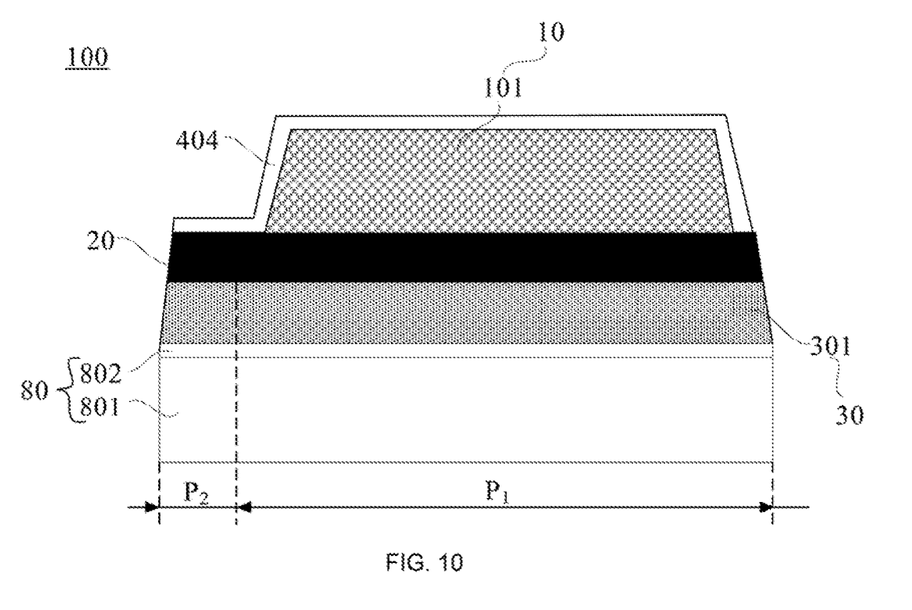

In step 904, as shown in FIG. 10, a first barrier film 404 is formed at a side of the base 80 at which the patterned first semiconductor layer 10 has been formed.

The first barrier film 404 may be formed by using any one of a physical vapor deposition process, a sputtering process, an evaporation process and a transfer process. For example, in a case where a material of the first barrier film 404 is conductive metal oxide or metal (such as molybdenum, aluminum, and copper), the physical vapor deposition process or the sputtering process or the evaporation process may be used to manufacture the first barrier film 404. In a case where the material of the first barrier film 404 is graphene, the transfer process may be used to transfer a single layer or a few layers (for example, 1 to 2 layers) of graphene, which is grown on copper by chemical vapor deposition, to the side of the base 80 at which the patterned first semiconductor layer 10 has been formed, and then the first barrier film 404 is formed.

Figure 11:
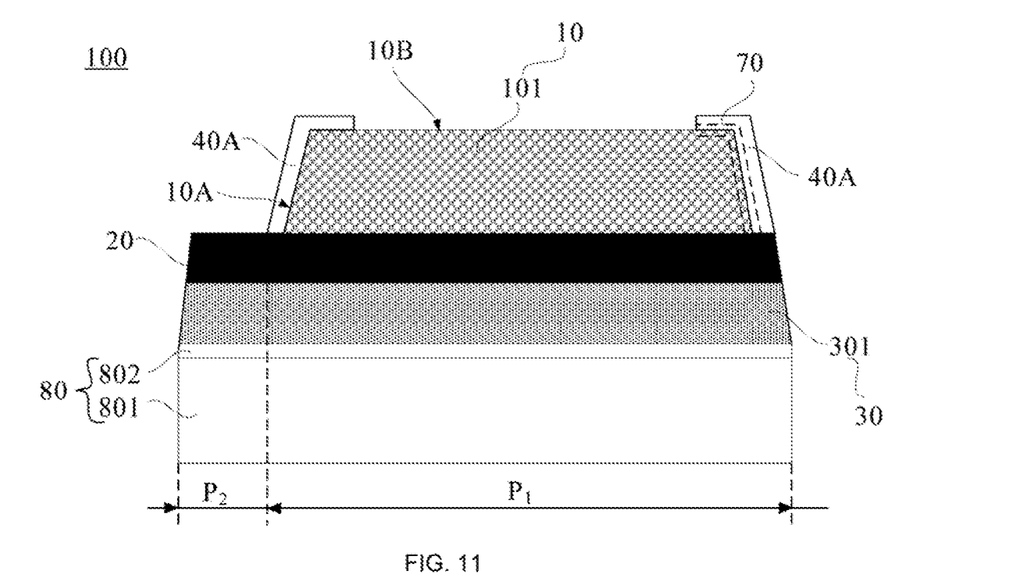

In step 905, referring to FIG. 11, the first barrier film 404 is patterned. A part of the first barrier film 404 covering the side face 10A of the patterned first semiconductor layer 10 is retained to form the first barrier layer 40A.

Parts of the first barrier film 404 that do not need to be retained may be removed by patterning the first barrier film 404 using a patterning process. For example, a part of the first barrier film 404 in the non-light-emitting region $P_2$ and a part of the first barrier film 404 located on the main surface 10B of the first semiconductor layer in the light-emitting region $P_1$ are removed, however, a part of the first barrier film 404 covering the side face 10A of the patterned first semiconductor layer 10 is retained to form the first barrier layer 40A.

The first barrier layer 40A is configured to form a charge depletion region 70 between the first barrier layer 40A and the first semiconductor layer 10. In this way, due to the presence of the charge depletion region 70, the carriers (holes or electrons) moving in the first semiconductor layer 10 are away from the side face 10A, and thereby the lateral current of the light-emitting diode may be suppressed. It is less likely for leakage current to occur in the side face 10A. The external quantum efficiency of the light-emitting diode 100 may be improved, and thus the luminescence efficiency of the light-emitting diode 100 may be improved.

In some embodiments, after the step 903, the method further includes the following steps.

Figure 12:
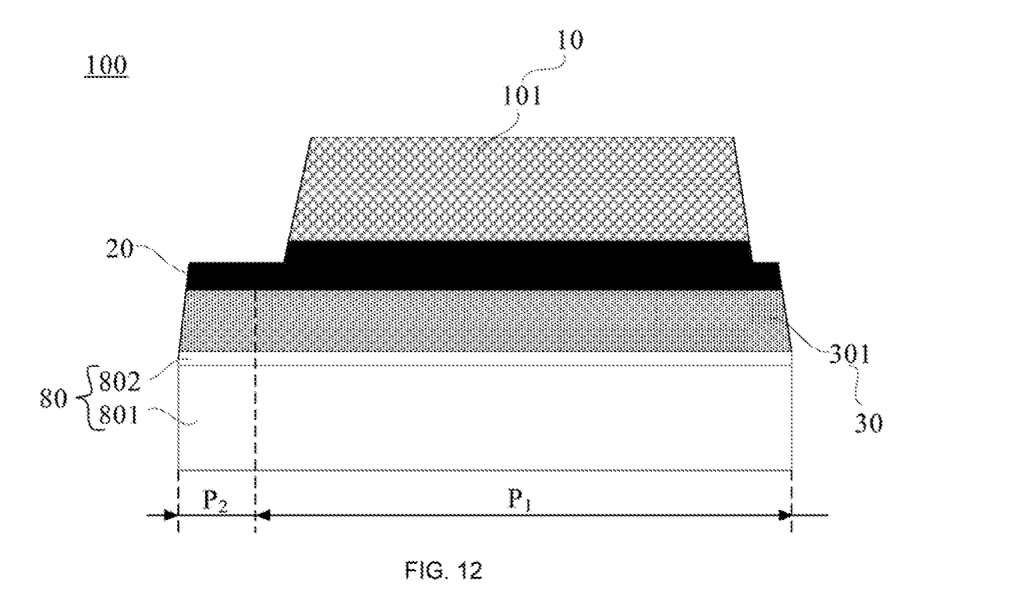

As shown in FIG. 12, a part of the light-emitting layer 20 at the edge of the light-emitting region $P_1$ is etched by using a mask used for patterning the first semiconductor layer 10. An etching depth is less than a thickness of the light-emitting layer. In this way, when the first barrier film 404 is subsequently manufactured, the first barrier film may cover a part of the side face of the light-emitting layer 20 proximate to the first semiconductor layer 10. Therefore, it is beneficial to reduce the difficulty of processing the first barrier layer 40A. Moreover, as shown in FIG. 13, the first barrier layer 40A effectively covers the entire side face 10A of the first semiconductor layer 10, and it is less likely for the leakage current to occur at an end of the side face 10A of the first semiconductor layer 10 proximate to the light-emitting layer 20.

Figure 13:
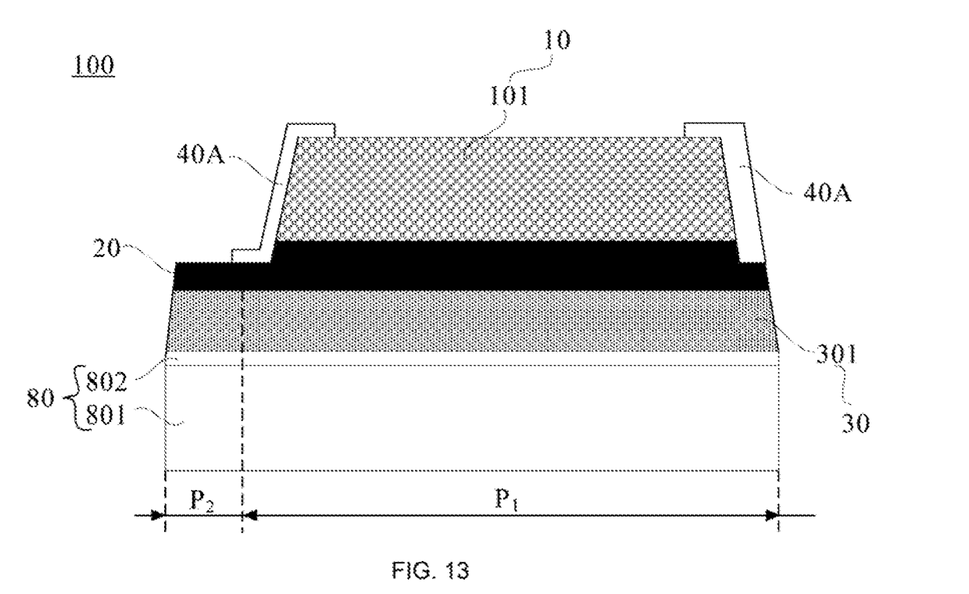

In some embodiments, as shown in FIGS. 11 and 13, in the step of patterning the first barrier film 404, a part of the first barrier film 404 covering an edge of the main surface 10B of the patterned first semiconductor layer 10 in the light-emitting region $P_1$ is retained. In this design, it is less likely for the leakage current to occur at an end of the side face 10A proximate to the main surface 10B, and it is beneficial to reduce the processing difficulty of forming the first barrier layer 40A.

Figure 14:
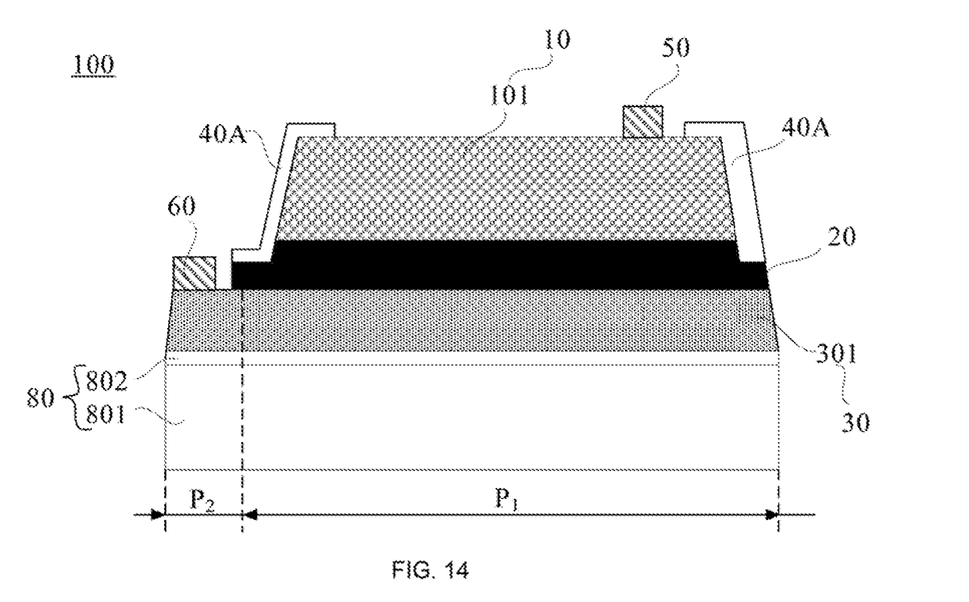

In some embodiments, as shown in FIG. 14, the method further includes the following steps.

A part of the light-emitting layer 20 in the non-light-emitting region $P_2$ is removed by patterning the light-emitting layer 20, so that a surface of a part of the second semiconductor layer 30 in the non-light-emitting region $P_2$ is exposed. Then, a second electrode 60 is formed on the exposed surface of the second semiconductor layer 30, and a first electrode 50 is formed on a surface of the patterned first semiconductor layer 10 away from the light-emitting layer 20.

In some embodiments, before the light-emitting layer is formed, the method further includes step 1 to step 3.

Figure 15:
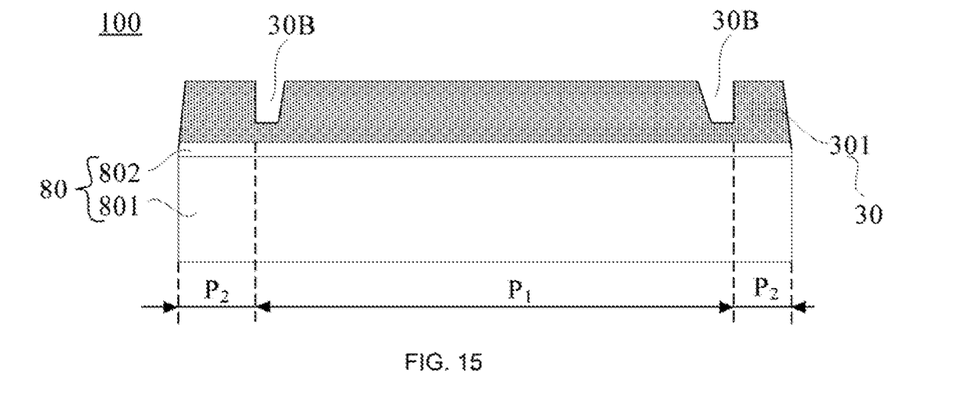
FIGS. 15-18 are schematic diagrams showing steps of manufacturing a second barrier layer, according to some embodiments of the present disclosure.
Figure 16:
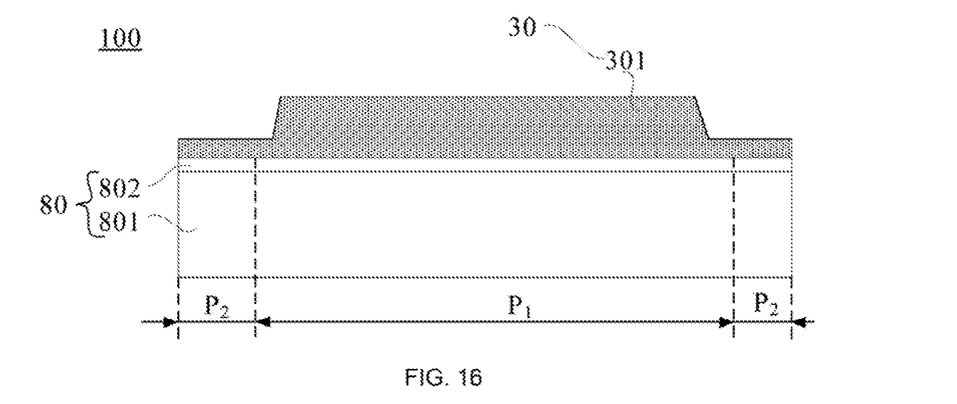

In step 1, as shown in FIGS. 15 and 16, the second semiconductor layer 30 is patterned to remove a part of the second semiconductor layer 30 at the edge of the light-emitting region $P_1$.

The step of patterning the second semiconductor layer 30 is the same as the step of patterning the first semiconductor layer 10 described above, which is not described herein again.

Exemplarily, when the second semiconductor layer 30 is patterned, only the part of the second semiconductor layer 30 at the edge of the light-emitting region $P_1$ of the light-emitting diode 100 is removed (as shown in FIG. 15). Or, a part of the second semiconductor layer 30 in the non-light-emitting region $P_2$ of the light-emitting diode 100 and the part of the second semiconductor layer 30 at the edge of the light-emitting region $P_1$ of the light-emitting diode 100 are removed simultaneously (as shown in FIG. 16). The non-light-emitting region $P_2$ here refers to a region of the light-emitting diode 100 other than the light-emitting region $P_1$.

As shown in FIG. 15, in a case where only the part of the second semiconductor layer 30 at the edge of the light-emitting region $P_1$ of the light-emitting diode 100 is removed, groove(s) 30B are formed in the second semiconductor layer 30. Exemplarily, an orthographic projection of the groove 30B on the base 80 has a closed frame shape; or, there is a plurality of grooves 30B, and the plurality of grooves 30B surround the second semiconductor layer 30, and are sequentially arranged and spaced apart from each other.

Figure 17:
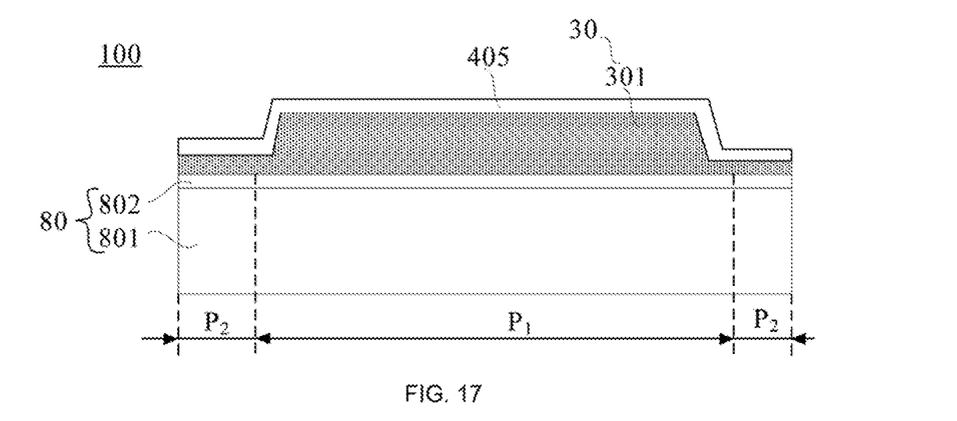

In step 2, as shown in FIG. 17, a second barrier film 405 is formed at a side of the base on which the patterned second semiconductor layer 30 has been formed.

The second barrier film 405 may be formed by using any one of a physical vapor deposition process, a sputtering process, an evaporation process and a transfer process. For example, in a case where a material of the second barrier film 405 is conductive metal oxide or metal (such as molybdenum, aluminum, and copper), the physical vapor deposition process or the sputtering process or the evaporation process may be used to manufacture the second barrier film 405. In a case where the material of the second barrier film 405 is graphene, the transfer process may be used to transfer a single layer or a few layers (for example, 1 to 2 layers) of graphene, which is grown on copper by chemical vapor deposition, to the side of the base 80 on which the patterned second semiconductor layer 30 has been formed, and then the second barrier film 405 is formed.

Figure 18:
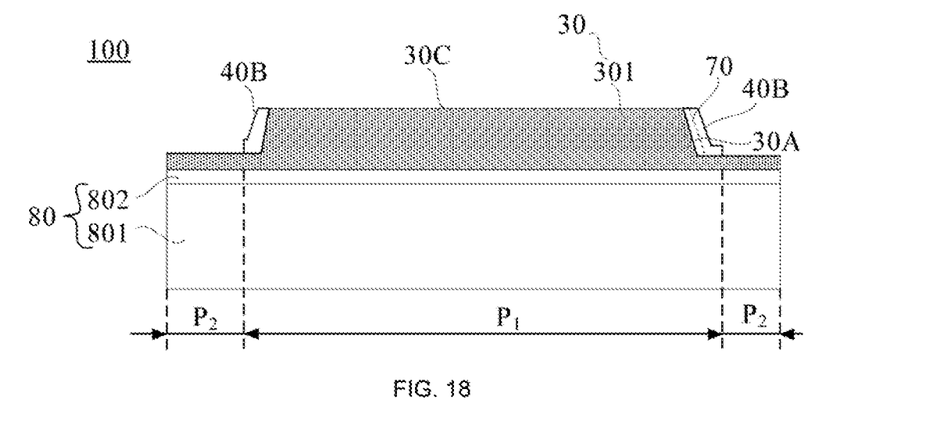

In step 3, as shown in FIG. 18, the second barrier film 405 is patterned. A part of the first barrier film covering a side face of the patterned second semiconductor layer is retained to form a second barrier layer. The second barrier layer is configured to form a charge depletion region between the second barrier layer and the second semiconductor layer.

Parts of the second barrier film 405 that do not need to be retained may be removed by patterning the second barrier film 405 using a patterning process. For example, a part of the second barrier film 405 in the non-light-emitting region $P_2$ and a part of the second barrier film 405 located on a main surface 30C of the second semiconductor layer in the light-emitting region $P_1$ are removed, however, a part of the second barrier film 405 covering the side face 30A of the patterned second semiconductor layer 30 is retained to form the second barrier layer 40B.

The second barrier layer 40B is configured to form a charge depletion region 70 between the second barrier layer 40B and the second semiconductor layer 30. In this way, due to the presence of the charge depletion region 70, the carriers (holes or electrons) moving in the second semiconductor layer 30 are away from the side face 30A, and thereby the lateral current of the light-emitting diode may be suppressed. It is less likely for leakage current to occur in the side face 30A. The external quantum efficiency of the light-emitting diode 100 may be improved, and thus the luminescence efficiency of the light-emitting diode 100 may be improved.

After forming the second barrier layer 40B, by using one or more of the above steps, the light-emitting layer 20 and the first semiconductor layer 10 are formed, and then the first barrier layer, the first electrode and the second electrode are also formed to produce the light-emitting diode 100 shown in FIG. 4.

Figure 19:
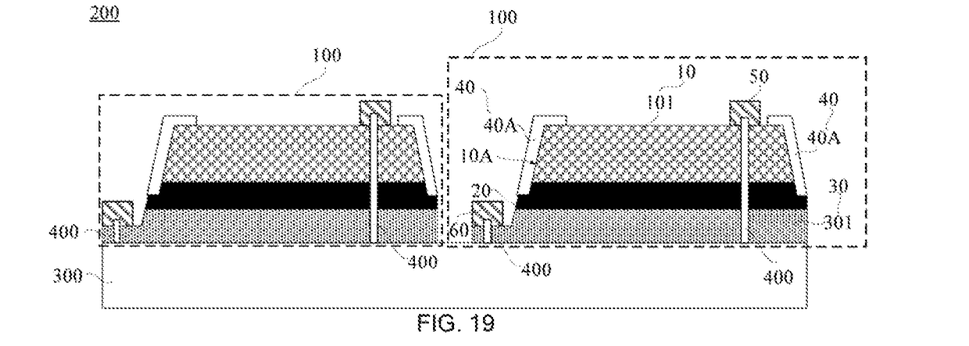
FIG. 19 is a schematic diagram showing a structure of a display device, according to some embodiments of the present disclosure.
Figure 20:
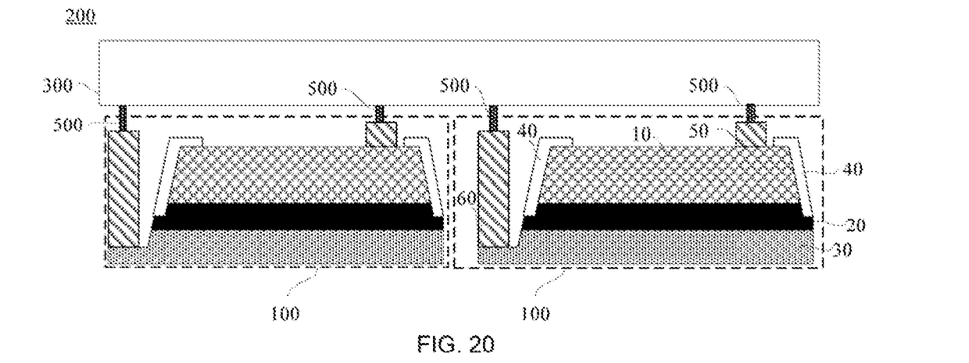
FIG. 20 is a schematic diagram showing a structure of another display device, according to some embodiments of the present disclosure.

Referring to FIGS. 19 and 20, some embodiments of the present disclosure provide a display device 200. The display device 200 includes a driving substrate 300 and a plurality of light-emitting diodes 100 mounted on a side of the driving substrate 300. Each light-emitting diode 100 is a light-emitting diode 100 described in any one of the embodiments, and each light-emitting diode 100 is electrically connected to the driving substrate 300. The driving substrate 300 is an active driving substrate or a passive driving substrate. The light-emitting diode 100 mounted on the driving substrate 300 does not include the base. That is, with respect to the light-emitting diode 100 manufactured by the above method, there is a need to remove the base before the light-emitting diode 100 is mounted on the driving substrate 300.

Exemplarily, as shown in FIG. 19, the driving substrate 300 is disposed on a side of the second semiconductor layer 30 away from the light-emitting layer 20. In this case, both the first electrode 50 and the second electrode 60 of each light-emitting diode 100 are connected to the driving substrate 300 by providing connection line(s) 400.

Exemplarily, as shown in FIG. 20, the driving substrate 300 is disposed at a side of the first semiconductor layer 10 away from the light-emitting layer 20. In this case, both the first electrode 50 and the second electrode 60 of each light-emitting diode 100 are connected to the driving substrate 300 through welding spot(s) 500.

Herein, it will be noted that one of the first semiconductor layer 10 and the second semiconductor layer 30 is a P-type semiconductor layer 101, and the other is an N-type semiconductor layer 301. For example, FIG. 19 shows an example in which the first semiconductor layer 10 is a P-type semiconductor layer 101 and the second semiconductor layer 30 is an N-type semiconductor layer 301.

Referring to FIGS. 19 and 20, in the light-emitting diode 100 in the display device 200, the barrier layer 40 is disposed on at least part of the side face of at least one of the first semiconductor layer 10 and the second semiconductor layer 30 (for example, as shown in FIG. 19, the first barrier layer 40A is disposed on the side face 10A of the first semiconductor layer 10), and the barrier layer 40 is configured to form a charge depletion region between the barrier layer 40 and the at least part of the side face. In this way, due to the presence of the charge depletion region, the carriers (holes and/or electrons) moving in the first semiconductor layer 10 and/or the second semiconductor layer 30 are away from the at least part of the side face, and thereby the lateral current of the light-emitting diode may be suppressed. It is less likely for leakage current to occur in the at least part of the side face. The external quantum efficiency of the light-emitting diode may be improved, and thus the luminescence efficiency of the light-emitting diode may be improved The forgoing descriptions are merely specific implementation manners of the present disclosure, but the protection scope of the present disclosure is not limited thereto. The protection scope of the present disclosure shall be subject to the protection scope of the claims.

What is claimed is:

1. A light-emitting diode, comprising:
   a first semiconductor layer;
   a second semiconductor layer;
   a light-emitting layer disposed between the first semiconductor layer and the second semiconductor layer; and
   a barrier layer disposed on at least part of a side face of at least one of the first semiconductor layer and the second semiconductor layer,
   wherein the barrier layer is configured to form a charge depletion region between the barrier layer and the at least part of the side face, and a material of the barrier layer includes at least one of metal, conductive metal oxide, graphene, and metallic carbon nanotube;
   the first semiconductor layer is a P-type semiconductor layer and the second semiconductor layer is an N-type semiconductor layer;
   the barrier layer includes a first barrier layer covering at least part of a side face of the P-type semiconductor layer, and a work function of the first barrier layer is less than a work function of the Ptype semiconductor layer; and
   the first barrier layer includes:
      a first main body portion covering the side face of the P-type semiconductor layer;
      a first extension portion connected to a side of the first main body portion proximate to the light-emitting layer, wherein the first extension portion covers a part of a side face of the light-emitting layer proximate to the P-type semiconductor layer, and a distance exists between the first extension portion and the N-type semiconductor layer in a direction perpendicular to a main surface of the light-emitting layer; and
      a second extension portion connected to a side of the first main body portion away from the light-emitting layer, wherein the second extension portion covers an edge of a main surface of the P-type semiconductor layer away from the light-emitting layer.

2. The light-emitting diode according to claim 1 wherein an orthographic projection of the first barrier layer on a main surface of the light-emitting layer has a closed frame shape.

3. The light-emitting diode according to claim 1 wherein the work function of the first barrier layer ranges from 4.0 eV to 5.5 eV.

4. The light-emitting diode according to claim 1 wherein an absolute value of a difference between the work function of the first barrier layer and the work function of the P- type semiconductor layer is greater than or equal to 0.3 eV.

5. The light-emitting diode according to claim 1 wherein a material of the first barrier layer includes at least one of metal, conductive metal oxide, graphene and metallic carbon nanotube.

6. The light-emitting diode according to claim 1, wherein the barrier layer further includes a second barrier layer covering at least part of a side face of the N-type semiconductor layer, and a work function of the second barrier layer is greater than a work function of the N-type semiconductor layer.

7. The light-emitting diode according to claim 6, wherein an orthographic projection of the second barrier layer on a plane determined by the light-emitting layer has a closed frame shape.

8. The light-emitting diode according to claim 6, wherein the work function of the second barrier layer ranges from 4.5 eV to 5.1 eV.

9. The light-emitting diode according to claim 6, wherein an absolute value of a difference between the work function of the second barrier layer and the work function of the N-type semiconductor layer is greater than or equal to 0.3 eV.

10. The light-emitting diode according to claim 6, wherein a material of the second barrier layer includes at least one of metal, conductive metal oxide, graphene and metallic carbon nanotube.

11. The light-emitting diode according to claim 1, wherein the barrier layer further includes a second barrier layer covering at least part of a side face of the N-type semiconductor layer; and
a distance exists between the first barrier layer and the second barrier layer in a direction perpendicular to a main surface of the light-emitting layer.

12. The light-emitting diode according to claim 1, wherein the second semiconductor layer has a main body region and a second electrode placement region, a part of the second semiconductor layer in the main body region overlaps the light-emitting layer and the first semiconductor layer, and a part of the second semiconductor layer in the second electrode placement region does not overlap the light-emitting layer and the first semiconductor layer;
the light-emitting diode further comprises:
a base disposed on a side of the second semiconductor layer away from the light-emitting layer;
a first electrode disposed on a main surface of the first semiconductor layer away from the light- emitting layer: and
a second electrode disposed in the second electrode placement region of the second semiconductor layer.

13. A method of manufacturing a light-emitting diode, comprising:
providing a base;
forming, on the base, a second semiconductor layer, a light-emitting layer and a first semiconductor layer sequentially on top of one another;
patterning the first semiconductor layer to remove a part of the first semiconductor layer at an edge of a light-emitting region of the light-emitting diode;
forming a first barrier film at a side of the base at which the patterned first semiconductor layer has been formed; and
patterning the first barrier film to retain a part of the first barrier film covering a side face of the patterned first semiconductor layer and form a first barrier layer; wherein the first barrier layer is configured to form a charge depletion region between the first barrier layer and the first semiconductor layer.

14. The method according to claim 13, after the step of patterning the first semiconductor layer, the method further comprising:
etching, by using a mask used for patterning the first semiconductor layer, a part of the light-emitting layer at the edge of the light-emitting region, an etching depth being less than a thickness of the light-emitting layer.

15. The method according to claim 14, wherein in the step of patterning the first barrier film, a part of the first barrier film covering an edge of a main surface of the patterned first semiconductor layer in the light-emitting region is retained.

16. The method according to claim 13, before forming the light-emitting layer, the method further comprising:
patterning the second semiconductor layer to remove a part of the second semiconductor layer at the edge of the light-emitting region;
forming a second barrier film at a side of the base on which the patterned second semiconductor layer has been formed; and
patterning the second barrier film to retain a part of the second barrier film covering a side face of the patterned second semiconductor layer and form a second barrier layer; wherein the second barrier layer is configured to form a charge depletion region between the second barrier layer and the second semiconductor layer.

17. A display device, comprising:
a driving substrate; and
a plurality of light-emitting diodes mounted on a side of the driving substrate, each light-emitting diode being a light-emitting diode according to claim 1, and each light-emitting diode being electrically connected to the driving substrate.

* * * * *